United States Patent
Kudymov et al.

(10) Patent No.: US 9,543,402 B1
(45) Date of Patent: Jan. 10, 2017

(54) INTEGRATED HIGH PERFORMANCE LATERAL SCHOTTKY DIODE

(71) Applicant: Power Integrations, Inc., San Jose, CA (US)

(72) Inventors: Alexey Kudymov, Ringoes, NJ (US); Jamal Ramdani, Lambertville, NJ (US)

(73) Assignee: Power Integrations, Inc., San Jose, CA (US)

(*) Notice: Subject to any disclaimer, the term of this patent is extended or adjusted under 35 U.S.C. 154(b) by 0 days.

(21) Appl. No.: 14/818,190

(22) Filed: Aug. 4, 2015

(51) Int. Cl.
| | |
|---|---|
| *H01L 29/205* | (2006.01) |
| *H01L 29/47* | (2006.01) |
| *H01L 29/872* | (2006.01) |
| *H01L 29/66* | (2006.01) |
| *H01L 29/40* | (2006.01) |
| *H01L 29/778* | (2006.01) |

(52) U.S. Cl.
CPC .......... *H01L 29/475* (2013.01); *H01L 29/205* (2013.01); *H01L 29/404* (2013.01); *H01L 29/66143* (2013.01); *H01L 29/66462* (2013.01); *H01L 29/7787* (2013.01); *H01L 29/872* (2013.01)

(58) Field of Classification Search
CPC .......... H01L 29/2003; H01L 29/7787; H01L 29/404; H01L 29/0619; H01L 29/0657; H01L 29/0661; H01L 29/402; H01L 29/42316; H01L 29/66462; H01L 29/7786; H01L 29/872
USPC .......... 257/E29.091, 201, E29.246, E29.255, 257/192, 194, 367
See application file for complete search history.

(56) References Cited

U.S. PATENT DOCUMENTS

| | | | | |
|---|---|---|---|---|
| 2009/0315075 A1* | 12/2009 | Sato | ...... | H01L 29/0657 257/192 |
| 2010/0314666 A1* | 12/2010 | Saito | ...... | H01L 29/0619 257/201 |
| 2012/0223366 A1* | 9/2012 | Wu | ...... | H01L 29/2003 257/194 |
| 2013/0161692 A1 | 6/2013 | Koudymov | | |

OTHER PUBLICATIONS

U.S. Appl. No. 14/581,645, filed Dec. 23, 2014, Alexey Kudymov.
Bahat-Treidel, E. et al., "Fast-Switching GaN-Based Lateral Power Schottky Barrier Diodes With Low Onset Voltage and Strong Reverse Blocking," IEEE Electron Device Letters, 2012 IEEE, pp. 1-3.

* cited by examiner

*Primary Examiner* — William F Kraig
*Assistant Examiner* — Edward Chin
(74) *Attorney, Agent, or Firm* — Blakely Sokoloff Taylor & Zafman LLP

(57) ABSTRACT

A diode includes a two-dimensional electron gas formed in a heterojunction defined between first and second semiconductor material layers. First and second layers of insulating material are disposed on the second semiconductor layer. First and second electrodes are disposed in the second layer of insulating material. The first electrode is coupled to the second semiconductor material layer. The second electrode is coupled to the heterojunction. Third and fourth layers of insulating material are disposed on the second insulating layer. A first via is disposed in the fourth layer of insulating material and coupled to the second electrode. A first field plate is disposed in the fourth layer of insulating material. An edge of the first field plate laterally extends towards first via. The first via is separated from an edge of the first via. The first field plate is coupled to the first electrode.

14 Claims, 7 Drawing Sheets

INTEGRATED HIGH PERFORMANCE LATERAL SCHOTTKY DIODE

BACKGROUND INFORMATION

Field of the Disclosure

The present invention relates generally to high electron-mobility transistors, in particular, to the design of GaN Schottky diodes and other components of high-electron-mobility transistors.

Background

The need for high voltage power switch transistors combined with high voltage output diodes is common in power conversion circuits such as buck-boost converters or the like. Power conversation circuits typically utilize discrete high voltage power switch transistors with discrete high voltage output diodes due to the lack of high voltage monolithic integrated solutions.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
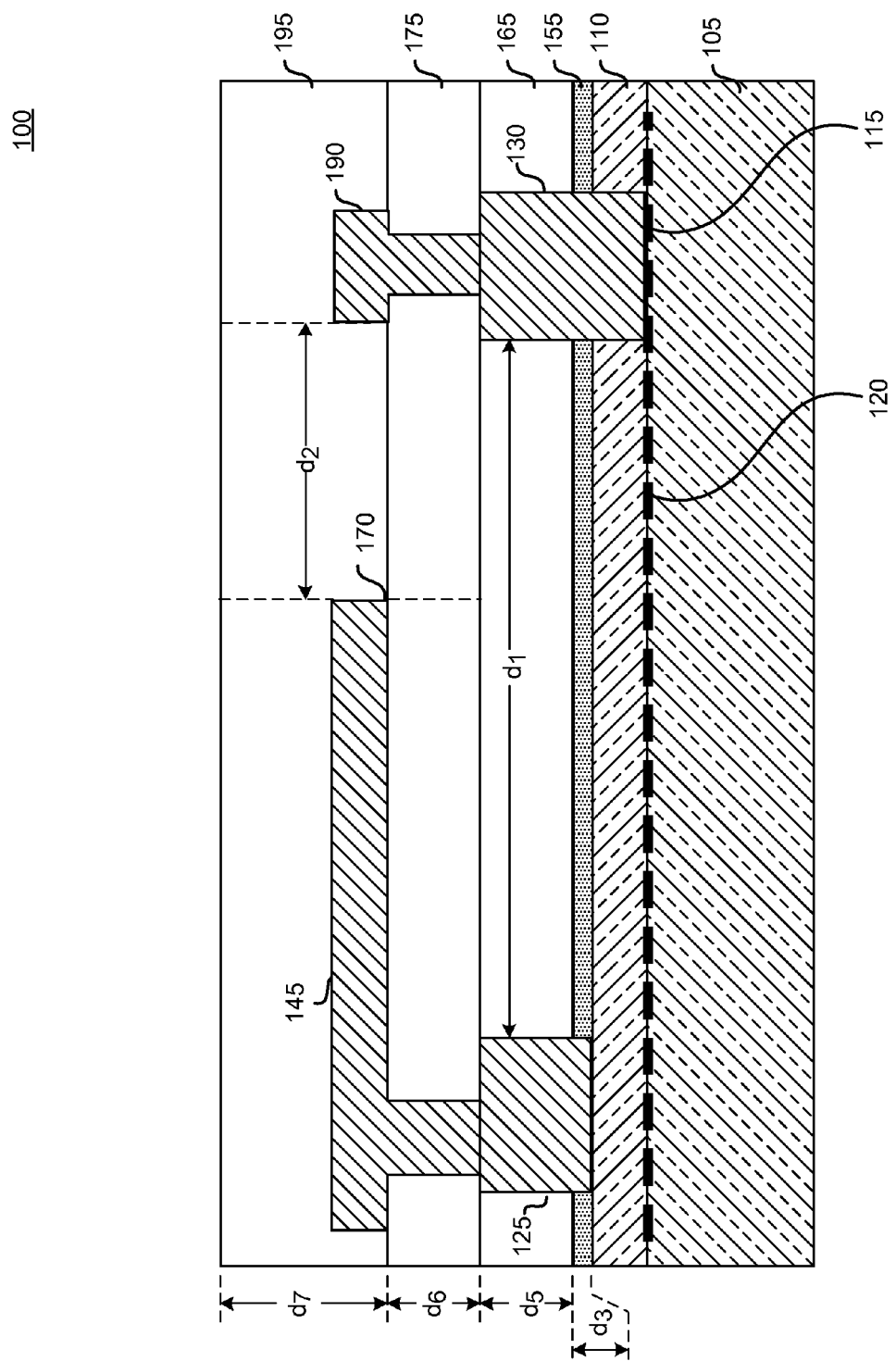
FIG. 1 is a cross-sectional view of a lateral-channel of a GaN Schottky diode, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of a GaN Schottky diode and the method to forming a GaN Schottky diode are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

FIG. 1 is a schematic representation of cross-sectional view of a lateral-channel GaN Schottky diode 100. GaN Schottky diode 100 includes a first semiconductor material 105 and a second semiconductor material 110 that contact one another to form a heterojunction 115.

In one example first semiconductor material 105 could be made of GaN, InN, Aln, AlGaN, InGaN, AlIn-Gan. In one example second semiconductor material 110 can be AlGaN, GaN, InN, Aln, InGaN, AlIn—GaN. Second semiconductor material 110 can also include compound semiconductors containing arsenic such as one or more of GaAs, InAs, AlAs, InGaAs, AlGaAs, InAlGaAs. Semiconductor materials 105, 110 can be formed above a substrate, e.g., above a gallium nitride, gallium arsenide, silicon carbide, sapphire, silicon, or other substrate. Semiconductor material 105 can either be in direct contact with such a substrate or one or more intervening layers can be present.

Due to the material properties of semiconductor materials 105, 110, a two-dimensional electron gas 120 arises at heterojunction 115. The compositions of first and second semiconductor materials 105, 110—which also can be referred to as "active layers"—a retailored such that two-dimensional electron gas 120 forms at heterojunction 115.

Schottky diode 100 also includes an anode 125, a cathode 130. In one example, anode 125, cathode 130 can be made from various electrical conductors including, e.g., metals such as Al, Ni, Ti, TiW, TiN, TiAu, TiAlMoAu, TiAlNiAu, TiAlPtAu, or the like.

In the illustrated implementation, the anode connected field plate 145 each has a generally rectangular cross-section. First edge 170 is vertically separated from a second semiconductor material 110 by the first layer of insulating material 155, the second layer of insulating material 165, and a third layer of insulating material 175. Anode-connected field plate 145 and first via 190 are covered by a fourth layer of insulating material 195.

First layer of insulating material 155 can be made from various dielectrics suitable for forming a gate insulator including, e.g., aluminum oxide ($Al_2O_3$), zirconium dioxide ($ZrO_2$), aluminum nitride (AlN), hafnium oxide ($HfO_2$), silicon dioxide ($SiO_2$), silicon nitride ($Si_3N_4$), aluminum silicon nitride (AlSiN), or other suitable gate dielectric materials. Second, third layers of insulating material 165, 175 can be made from various dielectrics including, e.g., silicon nitride, silicon oxide, silicon oxynitride, or the like. First, second, third, and fourth layers of insulating material 155, 165, 175, 195 can also be referred to as "passivation layers" in that layers 155, 165, 175, 195 each hinder or prevent the formation and/or charging of surface states in the respective of underlying second semiconductor material 110 or layers 155, 165, 175, 195.

In some implementations, second, third, and fourth layers of insulating material 165, 175, 195 have a composition so that—after extended operation at specified operational parameters so that a steady state is reached—the number of charge defects per area in insulating material layers 165, 175, 195 is less than the sheet carrier density at the heterojunction. In other words, the sum of the products of each three-dimensional defect density of insulating material layers 165, 175, 195 and the respective thickness of that layer is less than the (two-dimensional) sheet carrier density at heterojunction 115. For example, in some implementations, the number of charge defects per area in insulating material layers 165, 175, 195 is less than 20%, or less than 10%, of the sheet carrier density at heterojunction 115.

In some implementations, GaN Schottky diode 100 and the other GaN Schottky diodes described herein include an interlayer, e.g., an AlN interlayer.

As discussed further below, electric fields between each of anode-connected field plate 145 and heterojunction 115 are highest at the respective of first edge 170 under certain bias conditions.

Anode 125 can be electrically connected to anode-connected field plate 145 in a variety of different ways. In the illustrated implementation, anode 125 is electrically connected to anode-connected field plate 145. In other implementations, anode electrode 125 can be electrically connected to anode-connected field plate 145 outside of the illustrated cross-section. Anode 125 may also be referred to as a Schottky contact.

In the illustrated implementation, cathode 130 is electrically connected to a first via 190. Cathode 130 may also be referred to as an ohmic contact. First via 190 extends through third layer of insulating material 175 to a same vertical level as anode-connected field plate 145, thus acting as an extension of cathode 130. First via 190 is also the nearest extension of cathode 130 to anode-connected field plate 145. The side of anode-connected field plate 145 that includes bottom, first edge 170 is disposed a lateral distance d2 away from the first via 190 at the same vertical level. In some implementations, lateral distance d2 is no greater than that needed to maintain a device-specific lateral dielectric breakdown voltage for a device-specific device lifetime.

In the illustrated implementation, anode 125 rests directly on upper surface of second semiconductor material 110 to make electrical contact. Cathode 130 rests on a surface of hetereojunction 115 to provide a low resistance electrical contact to the semiconductor. In some implementations, this penetration is deep enough such that anode 125 and/or cathode 130 contact or even pass through heterojunction 115. As another example, in some implementations, one or more interstitial glue metal or other conductive materials are disposed between anode 125 and/or cathode 130 and one or both of semiconductor materials 105, 110. There is a lateral distance d2 from a first edge 170 to an edge of via 190. The lateral distance d2 may be between 1 and 8 micrometers, e.g., between 2 and 6 micrometers. In some implementations, the thickness of fourth layer of insulating material 195 is between 0.4 and 3 micrometers, e.g., between 0.5 and 2 micrometers. There is a lateral distance d1 from the anode to the cathode. In some implementations, lateral distance d1 is between 1 and 5 micrometers.

Figure 2:
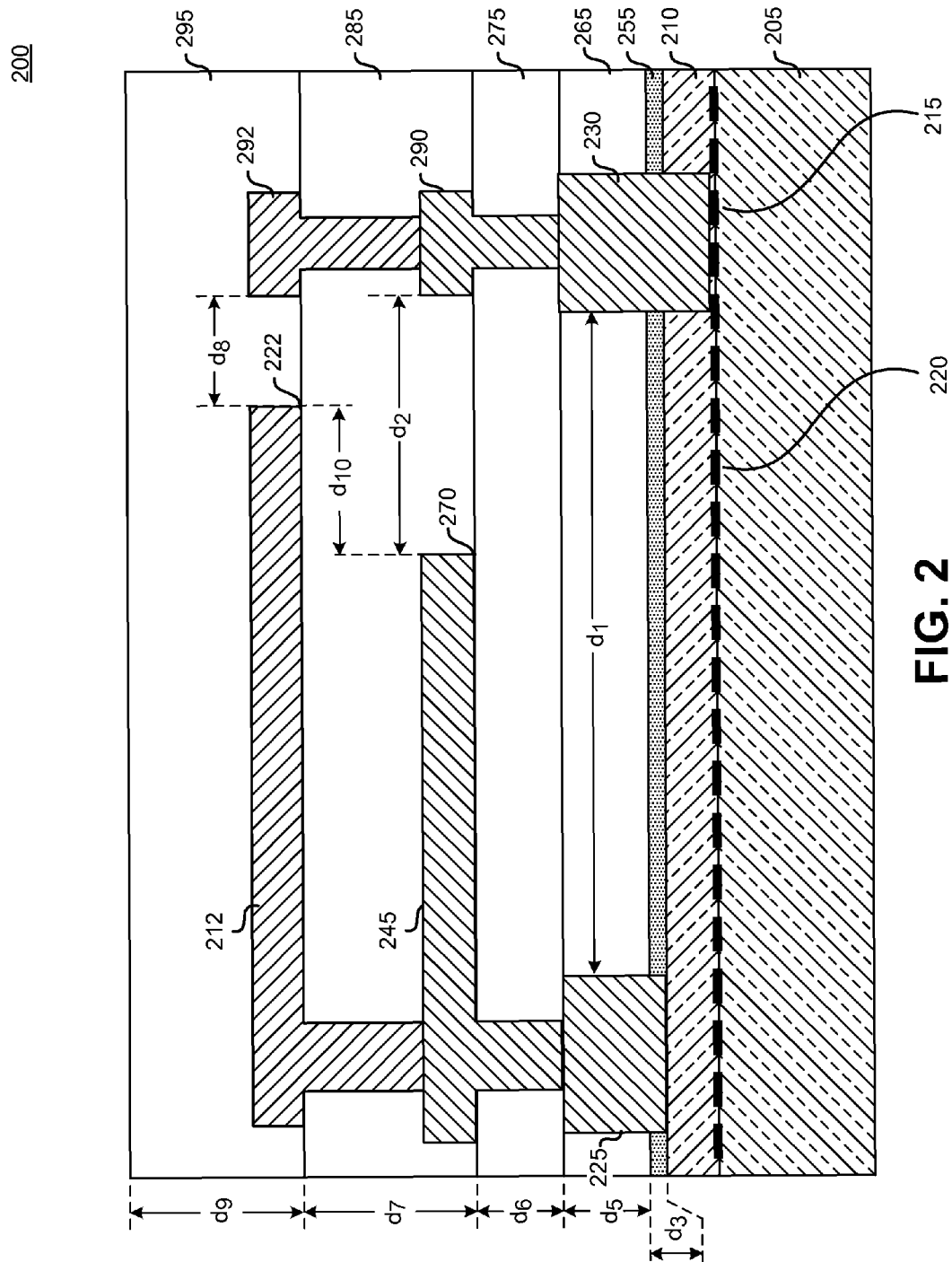
FIG. 2 is a cross-sectional view of a lateral-channel of a GaN Schottky diode, in accordance with the teachings of the present disclosure.

FIG. 2 is a schematic representation of cross-sectional view of a lateral-channel GaN Schottky diode 200. In addition to semiconductor materials 205, 210, electrodes 225, 230, and cathodes via 290, GaN Schottky diode 200 includes a vertically-layered field plate structure including multiple field plates. Second anode-connected plate 212 is electrically connected to anode electrode 225. Second anode-connected plate 212 covers first anode-connected field plate 245.

In some implementations, second anode-connected plate 212 acts as a so-called "shield wrap." GaN Schottky diodes may suffer from parasitic dc-to-rf dispersion that is believed to arise at least in part due to the exchange of surface charges with the environment during the high operation. In particular, surface states charge and discharge with relatively slow response times and high frequency operation of the GaN Schottky diode suffers. Metallic shield wraps can mitigate or eliminate these effects by improving the shielding the surface states and preventing the exchange of surface charges. In some implementations, second anode-connected plate 212 acts as a field plate to reduce the peak values of electric fields in GaN Schottky diode 200, e.g., the electric field between heterojunction 215 and, e.g., bottom, first edge 270 of an anode-connected field plate. In some implementations, second anode-connected plate 212 also acts to deplete heterojunction 215 of charge carriers, as discussed further below. In some implementations, second anode-connected plate 212 provides multiple use such as acting as two or more of a shield wrap, a field plate, and to deplete heterojunction 215. The particular capacity of second anode-connected plate 212 in any device will be a function of any of a number of different geometric, material, and operational parameters. Because of the possibility for second anode-connected plate 212 to perform one or more roles, it is referred to herein simply as a "anode-connected plate."

In the illustrated implementation, second anode-connected plate 212 has a generally rectangular cross-section. Second source-connected plate 212 includes a bottom, second edge 222. Second edge 222 is disposed a lateral distance d10 from the first source-connected plate 245 and a vertical distance d3+d5+d6+d7 above second semiconductor material 210. In one example, the lateral distance d10 may be in the range of 5 micrometers to 10 micrometers. In one example, the vertical distance of d3 may be in the range of 10 nanometers to 70 nanometers, d5 may be in the range of 10 nanometers to 100 nanometers, d6 may be in the range of 0.1 micrometers to 0.3 micrometers, and d7 may be in the range of 0.25 micrometers to 1 micrometer. Second edge 222 is vertically separated from second semiconductor material 210 by the first layer of insulating material 255, second layer of insulating material 265, third layer of insulating material 275, and fourth layer of insulating material 295. As discussed further below, the electric field between second anode-connected plate 212 and heterojunction 115 are highest at bottom, cathode-side edge 222 under certain bias conditions.

Second anode-connected plate 212 can be electrically connected to anode 225 in a variety of different ways. In other examples, anode 225 can be electrically connected to second source-connected plate 212 outside of the illustrated cross-section.

In the illustrated implementation, cathode 230 is electrically connected to a second via 292 by way of first via 290. Second via 292 extends through fourth layer of insulating material 295 to a same vertical level as second anode-connected plate 212, thus acting as an extension of cathode 230. Second via 292 by virtue of being on the same vertical level as second anode-connected plate 212, is the nearest extension of cathode 230 to second anode-connected plate 212. The second edge 222 of second anode-connected plate 212 is disposed a lateral distance d8 away from the second via 292 at the same vertical level are covered by a fifth layer of insulating material 295.

In some implementations, lateral distance d8 is between 1 and 10 micrometers, e.g., between 2 and 6 micrometers. In some implementations, second, third, fourth, and fifth layers of insulating material 265, 275, 285, 295 have a composition so that—after extended operation at specified operational parameters so that a steady state is reached—the number of charge defects per area in insulating material layers 265, 275, 285, 295 is less than the sheet carrier density at the heterojunction. In other words, the sum of the products of each three-dimensional defect density of insulating material layers 265, 275, 285, 295 and the respective thickness of that layer is less than the (two-dimensional) sheet carrier density at heterojunction 215. For example, in some implementations, the number of charge defects per area in insulating material layers 265, 275, 285, 295 is less than 20%, e.g., less than 10%, of the sheet carrier density at heterojunction 215.

Figure 3:
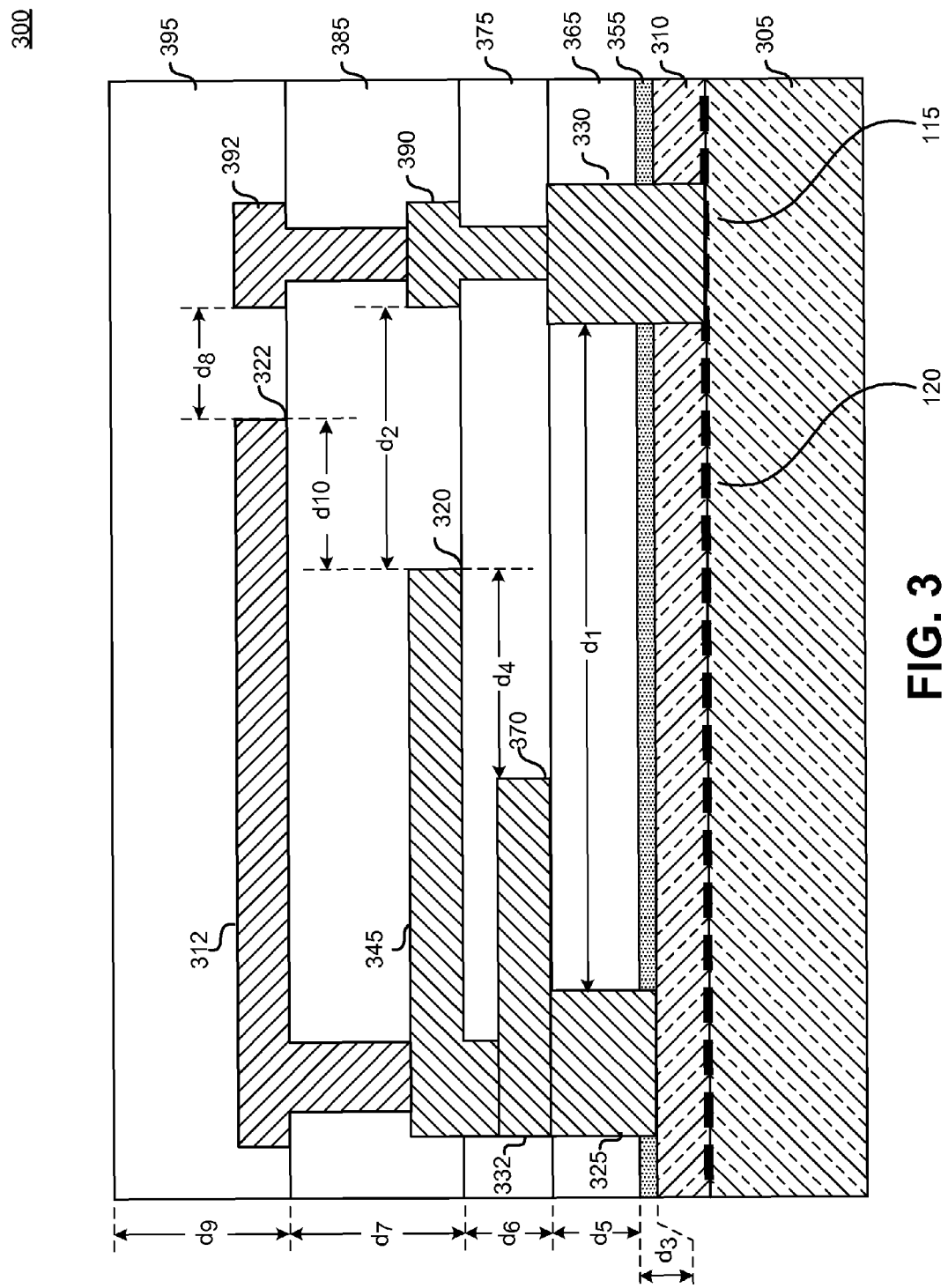
FIG. 3 is a cross-sectional view of a lateral-channel of a GaN Schottky diode, in accordance with the teachings of the present disclosure.

FIG. 3 is a schematic representation of cross-sectional view of a lateral channel GaN Schottky diode 300. In addition to semiconductor materials 305, 310, electrodes 325, 330, and second via 392, GaN Schottky diode 300 includes a vertically-layered field plate structure. First edge 370 of first anode connected field plate 332 is disposed a lateral distance d4 from the second edge 320 of anode-connected field plate 370. Second edge 320 of second anode-connected field plate 345 is disposed a lateral distance d2+d4 towards cathode 330 from a side of anode 325 and a vertical distance d3+d5+d6 above second semiconductor material 110. Third edge 322 of third anode-connected field plate 312 is disposed a distance d8 from second via 392. Second edge 320 is vertically separated from second semiconductor material 310 by first layer of insulating material 355, second layer of insulating material 365, and third layer of insulating material 375. As discussed further below, the electric field between second-anode field plate 345 and heterojunction 315 are highest at bottom, second edge 320 under certain bias conditions.

Third anode-connected field plate 312 can be electrically connected to anode electrode 325 in a variety of different ways. In the illustrated implementation, third cathode-connected field plate 312 is electrically connected to first anode anode-connected field plate 332.

In operation, GaN Schottky diodes such as the ones shown in 100, 200, 300 are switched between the ON state and the OFF state. The GaN Schottky diodes may exhibit low onset voltages. In many applications, it is desirable that the ON state resistance of the GaN Schottky diode be as low as practical, e.g., the power losses in the GaN Schottky diode become undesirably high and/or the GaN Schottky diode heat excessively.

FIGS. 4A, 4B are graphs 405, 410 that illustrate the voltage and electric field at the heterojunction between the anode and the cathode of some implementations of GaN Schottky diodes in an OFF-state. The GaN Schottky diode implementations include a higher-field plate structure (e.g., FIGS. 2, 3). It is to be understood that graphs 405, 410 are highly schematic representations in that the voltage and electric field are a function of variety of parameters, including but are not limited to geometric parameters (including, e.g., number, dimensions, and arrangement of GaN Schottky diodes features), material parameters (including, e.g., dielectric constants of materials, material density, work functions, dopant concentration, defect concentration, surface state composition, and surface state concentration), and operational parameters (including, e.g., temperature, gate voltage, and source-drain voltage). Moreover, even for a single device, such parameters may change over time, e.g., as the device ages or as operational states change. The slopes of the lines, the magnitude of peaks, the number of peaks, and other characteristics will thus vary, e.g., depending on the particular device and operating conditions. The graphs in FIG. 4A, FIG. 4B thus should be interpreted as representations for illustrative purposes.

The graph in FIG. 4A includes a first vertical axis 410, a second vertical axis 414 and a horizontal axis 415. First vertical axis 410 denotes voltage of the anode. Second vertical axis denotes voltage of the cathode. Horizontal axis 415 denotes the lateral position along the heterojunction of a GaN Schottky diode between the anode and the cathode.

The graph in FIG. 4B includes a vertical axis 425 and a horizontal axis 430. Vertical position along axis 425 denotes the magnitude of the electric field. Horizontal axis 430 denotes lateral position along the heterojunction of the GaN Schottky diode between the anode and the cathode. Horizontal axis 415, 430 is referenced to edges 170, 320 of GaN Schottky diodes 100, 200, 300 (FIGS. 1, 2, 3) for illustrative purposes.

As shown with the illustrated Schottky diode in the OFF state as shown in FIG. 4A, the electric field near the anode is approximately zero. Under the illustrated bias conditions—wherein the anode is biased to locally deplete charge carriers from the heterojunction—the electrical impedance per unit of length of the heterojunction increases in the vicinity of the anode and reaches a local maximum almost directly beneath the bottom, first edge 170 of the plate. The localized depletion of charge carriers in the vicinity of bottom, first edge 170 of the gate gives rise to a voltage change in the vicinity 445 and a local maximum 450 in the electric field.

Under the illustrated parameters, the depletion of the charge carriers from the heterojunction by the anode-connected field plate also decrease moving toward the cathode or charge carriers increase moving toward the cathode until the heterojunction becomes essentially conductive in the vicinity 445 of the cathode and is found at a voltage that approximately equals the cathode voltage $V_C$ 414. Accordingly, the electric field 425 value approaches zero at the end of horizontal axis 430. The entire potential difference between the source and the $V_{AC}$ is supported across the lateral length of the heterojunction and the GaN Schottky didoe is in an OFF (non-conductive) state. As discussed above, FIGS. 4A, 4B are schematic representations for didactic, illustrative purposes. Other GaN Schottky diodes under other operational conditions may support the potential difference between the anode and the cathode in other ways, including having additional or fewer peaks, peaks with different slopes, and peaks of different peaks, as well as other characteristics.

Figure 5:
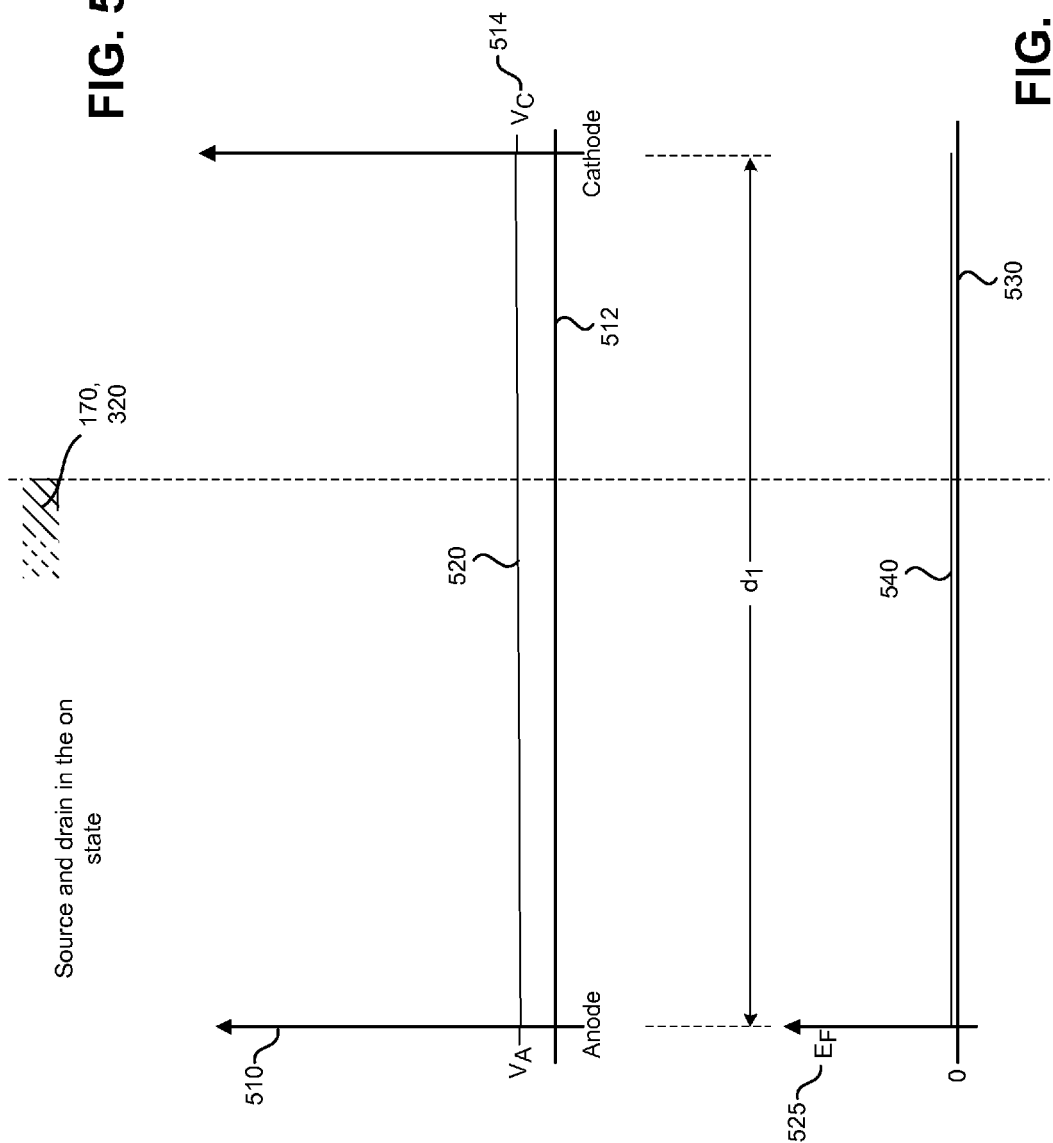
FIG. 5A, 5B are graphs that represent the voltage and electric field at the heterojunction between the anode and the cathode of some implementations of GaN Schottky in an ON-state in accordance with the teachings of the present disclosure.

FIGS. 5A, 5B are graphs 505, 510 that represent the voltage and electric field at the heterojunction between the anode and the cathode of some implementations of GaN Schottky diodes in an ON-state. The GaN Schottky diode implementations can include a single field plate structure (e.g., FIG. 1) or higher-field plate structures (e.g., FIGS. 2, 3). Graphs 505, 510 are representations of the voltage and electric field for one variety of parameters, and may change over time.

The graph in FIG. 5A includes a first vertical axis 510, second vertical axis 514 and a horizontal axis 512. First vertical axis 510 denotes voltage of the anode. Second vertical axis 514 denotes voltage of the cathode. Horizontal axis 512 denotes position denotes along the heterojunction of a GaN Schottky diode between the anode and the cathode.

The graph in FIG. 5B includes a vertical axis 525 and a horizontal axis 530. Vertical axis 525 denotes the magnitude of the electric field. Horizontal axis 530 denotes position along the heterojunction of the GaN Schottky diode between the anode and the cathode. Lateral position along horizontal axis 515, 530 is referenced to edges 170, 320 of GaN Schottky diode s 100, 200, 300 (FIGS. 1, 2, 3) for illustrative purposes.

In the ON state under the illustrated geometric, material, and operational parameters, the heterojunction is conductive and the anode and the cathode are at essentially the same voltage. Even under the illustrated parameters, the heterojunction does however have a finite, non-zero resistance and the anode voltage and the cathode voltage are not identical. For illustrative purposes, voltage 520 is represented with a slight but uniformly rising slope and electric field 540 with a minimal but uniform non-zero value, as would be the case if the heterojunction had an ideally uniform resistivity over the entire channel length. This is not necessarily the case. For example, the finite resistivity of the heterojunction may vary with lateral position due to localized variations in contact potentials, carrier density, defect density, and/or other parameters despite being conductive.

As another example, the current at the heterojunction may become space charge limited under certain geometric, material, and operational parameters, e.g., if the number of carriers at the heterojunction is relatively low in comparison with the current that would be conducted by an ideal conductor. A relatively higher potential difference between the anode and the cathode and electric field could result.

As discussed above, FIGS. 5A, 5B are thus also schematic representations for didactic, illustrative purposes. The vertical position of voltage 520 along axis 510 will depend upon the deployment of the GaN Schottky diode, e.g., whether the GaN Schottky diode is deployed on the high side or low side of a load.

Figure 6:
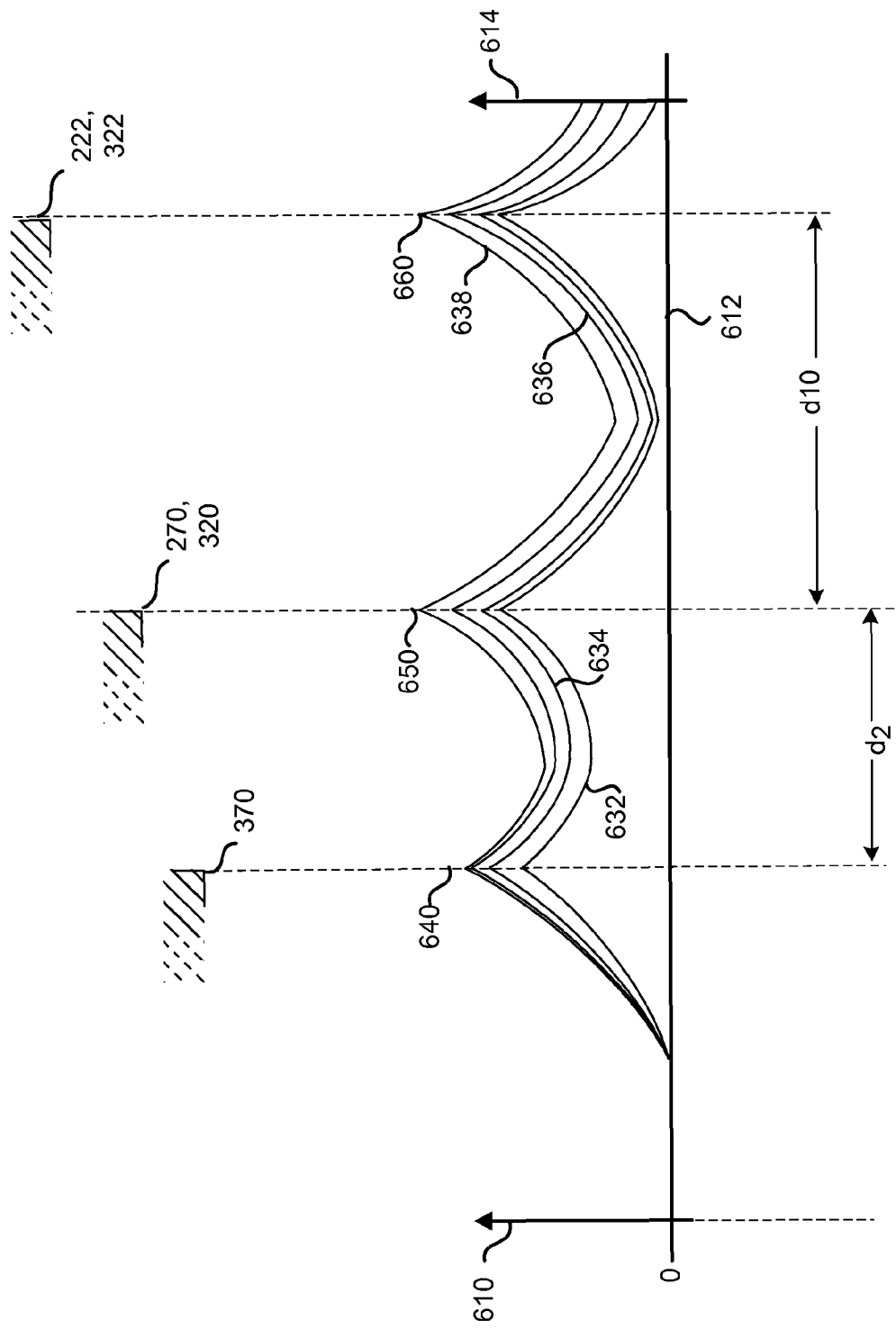
FIG. 6 is a graph that represents the electric field at a heterojunction of some implementations of GaN Schottky diode in an OFF-state for fixed anode potential but a variety of different discrete cathode potentials in accordance with the teachings of the present disclosure.

FIG. 6 is a graph that schematically represents the electric field at the heterojunction between the anode and the cathode of some implementations of GaN Schottky diodes in an OFF-state for fixed anode potential but a variety of different discrete cathode potentials. The graph is a highly schematic representation that is presented for didactic, illustrative purposes. The GaN Schottky diode implementations include a single-field plate structure (e.g., FIG. 1) or higher-field plate structures (e.g., FIGS. 2, 3).

Graph includes a vertical axis 610 and a horizontal axis 612. Vertical position along axis 610 denotes the magnitude of the electric field. Horizontal axis 612 denotes lateral position along the heterojunction of the GaN Schottky diode between the anode and the cathode. Lateral position along horizontal axis 612 is referenced to edges 370, 270, 320, 222, and 322 of GaN Schottky diodes 200, 300 (FIGS. 2, 3) for illustrative purposes.

Figure 4:
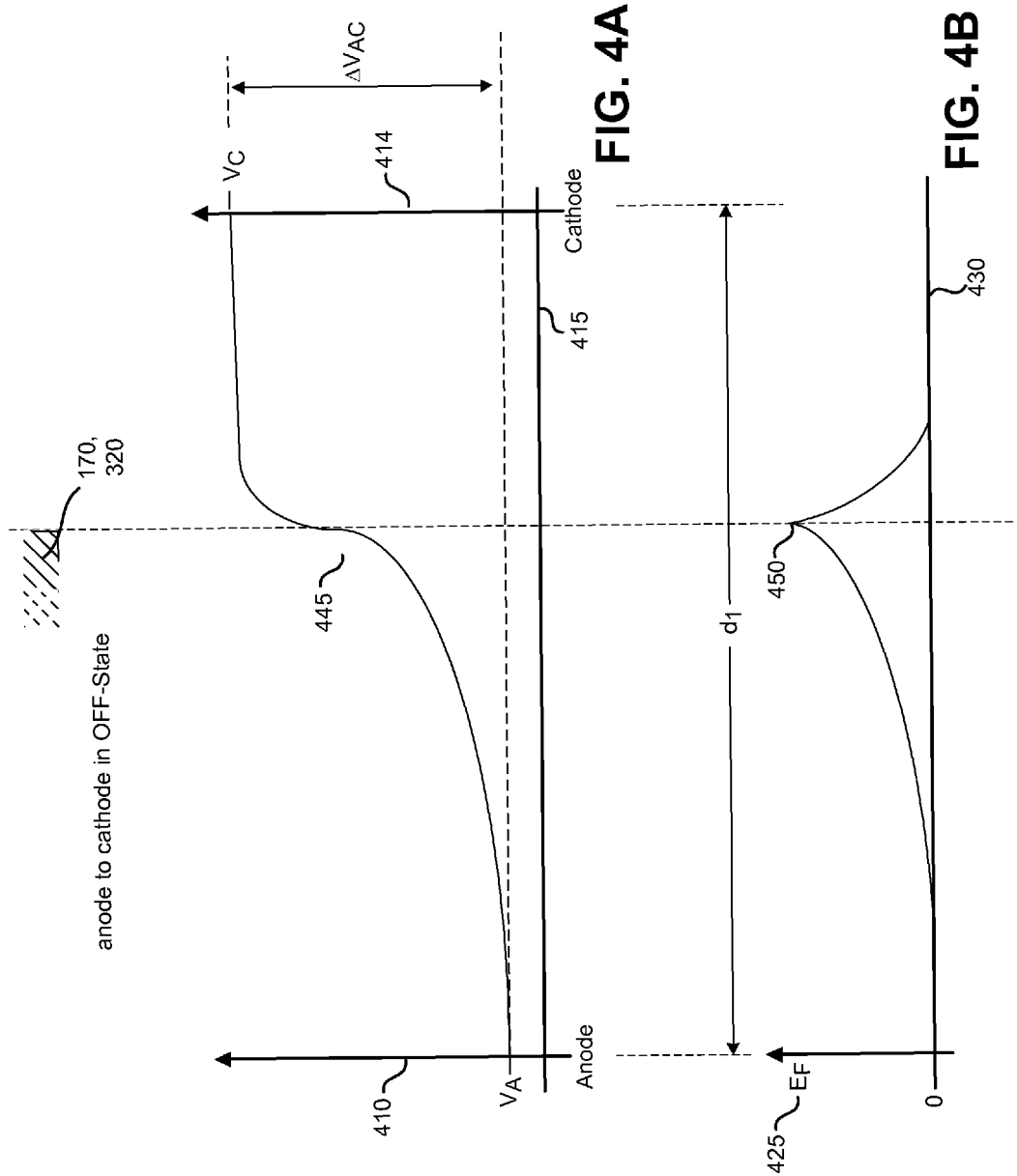
FIG. 4A, 4B are graphs that represent the voltage and electric field at the heterojunction between the source and the drain of some implementations of the GaN Schottky diode in an OFF-state in accordance with the teachings of the present disclosure.

Similar to FIG. 4, the magnitude of the electric field rises due to the presence of the edges of the anode-connected field plates. A local maximum of the electric field occurs associated with edges respectively. For example, a first local maximum 640 in the electric field occurs due to the presence of the first anode connected plate edge 370. A second local maximum 650 occurs due to the presence of the second anode-connected plate edge 270, 320. A third local maximum 660 occurs due to the presence of the third anode-connected plate edge 222, 322. Lines 632, 634, 636, 638 represent fixed anode potential but a variety of different discrete cathode potentials. Thus lines 632-638 start at approximately the same starting point, but have discrete cathode potentials. The discrete cathode potential however exhibit similar behavior at each anode-connected field plate.

The potential difference between the anode and the cathode is supported across the lateral length of the heterojunction in the OFF state. Under the illustrative parameters, bottom, second edge 222 of second anode-connected plate 210 also depletes of the charge carriers from the heterojunction and gives rise to an electric field near second edge 222. The geometric and material properties of the GaN Schottky diode can thus be tailored so that—for common operational conditions—a portion of the heterojunction in vicinity of the cathode is depleted due to the vertically-oriented voltage difference between the heterojunction and second anode-connected plate 210. One example of such operational conditions are, e.g., within 150 degrees Celsius of room temperature, or within 125 degrees Celsius of room temperature.

By tailoring the geometric and material properties in this way, the potential difference and hence electric field between the heterojunction and second anode-connected plate 210 can be reduced while the device is in the OFF state. In particular, because some portion of the potential difference between the anode and the cathode is dropped along heterojunction 115 in vicinity 455 of the cathode, the full potential difference between the anode and the cathode is not applied between second anode-connected plate 210 and the portion of heterojunction 115 that underlies second anode-connected plate 210. Instead, a lower potential difference exists which, e.g., reduces the likelihood of charge injection into intervening insulating material(s) and/or dielectric breakdown.

In some implementations, GaN Schottky diodes have geometric and material properties that are tailored to operate at least the maximum specified potential difference between the anode and the cathode between the heterojunction and second anode-connected plate 210 for at least short periods of time. In particular, although GaN Schottky diodes may spend a relatively large percentage of their operational lifetimes in the OFF state, potentials approaching the maximum operational potential difference between the anode and the cathode may transiently appear between the heterojunction and first anode-connected plate 245 during switching. In one example, it is noted that the depletion and reaccumulation processes at the heterojunction may not occur uniformly along the entire lateral length of the heterojunction. For example, in the context of switching between an OFF state and an ON state, a portion of heterojunction 115 in vicinity 445 may (re-) accumulate charge more rapidly than other portions of heterojunction 115. In this case, heterojunction could become conductive in the vicinity 445 before other portions of heterojunction 115. During this transient state, the cathode voltage could extend into vicinity 445 and the entire potential difference between the anode and the cathode would be supported between the second anode-connected plate 210 and underlying portion of the heterojunction 115.

Figure 7:
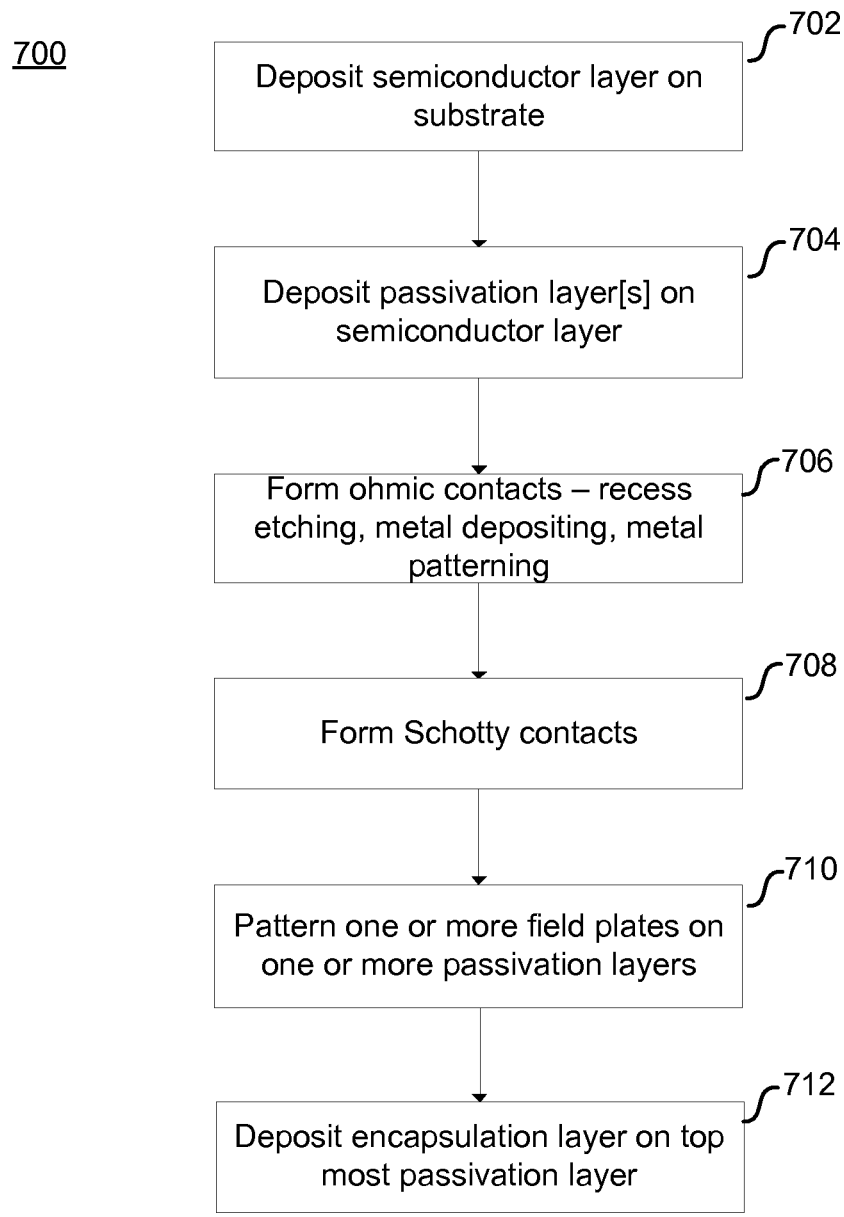
FIG. 7 is a flow diagram that represents a method to fabricate the GaN Schottky diode in accordance with the teachings of the present disclosure.

FIG. 7 describes a method to fabricating the GaN Schottky diode in the present disclosure. In block 702, a semiconductor layer is deposited on the substrate. In one example, the semiconductor layer may comprise of any of the materials listed in FIGS. 1-3, while the substrate may comprise of any of the materials listed in FIGS. 1-3. Process 700 proceeds to block 704. In block 704, one or more passivation layers may be deposited on the semiconductor layer. Process 700 proceeds to block 706. In block 706, ohmic contacts are formed by recess etching, metal depositing, and metal patterning. The ohmic contacts go through the passivation layer and is in contact with the two-dimensional electron gas. Process 700 proceeds to block 708. In block 708, the Schottky contacts are formed. The Schottky contacts are in contact with the top surface of the insulation layer such example as in FIG. 1, FIG. 2, FIG. 3 respectively. Process 700 proceeds to block 710. In block 710, one or more field plates may be patterned on one or more passivation layers. Process 700 proceeds to block 712. In block 712, an encapsulation layer is deposited on top most passivation layer.

A number of implementations have been described. Nevertheless, it is to be understood that various changes are to be made. For example, although the illustrated implementations are for lateral-channel GaN Schottky diode, the same techniques can be applied to vertical-channel GaN Schottky diodes provided that a vertical heterojunction can be formed.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A diode, comprising:
   a two-dimensional electron gas formed in a heterojunction defined at an interface between first and second semiconductor material layers;
   first and second layers of insulating material disposed on the second semiconductor layer;
   a first and second electrodes disposed in the second layer of insulating material, wherein the first electrode disposed a first lateral distance from the second electrode, wherein the first electrode is coupled to the second semiconductor material layer through the first layer of insulating material, wherein the second electrode is coupled to the heterojunction through the first layer of insulating material and the second layer of insulating material;
   third and fourth layers of insulating material disposed on the second insulating layer;
   a first via disposed in the fourth layer of insulating material and coupled to the second electrode through the third layer of insulating material; and
   a first field plate disposed in the fourth layer of insulating material, wherein an edge of the first field plate laterally extends towards first via in the fourth layer of insulating material, wherein the first via and is separated in the fourth layer of insulating material by a second lateral distance from an edge of the first via, wherein the first field plate is coupled to the first electrode through the third layer of insulating material.

2. The diode of claim 1 wherein the first field plate is vertically separated from the second semiconductor material layer by the first layer of insulating material, the second layer of insulating material, and the third layer of insulating material.

3. The diode of claim 1 wherein the first electrode is a Schottky contact of the diode and wherein the second electrode is an ohmic contact of the diode.

4. The diode of claim 1 wherein the first electrode is an anode of the diode and wherein the second electrode is a cathode of the diode.

5. The diode of claim 4 wherein the first field plate is a first anode connected field plate.

6. The diode of claim 5 wherein the first field plate has a rectangular cross-section.

7. The diode of claim 1 wherein the first semiconductor material layer comprises at least one of GaN, InN, Aln, AlGaN, InGaN, or AlIn—GaN.

8. The diode of claim 1 wherein the second semiconductor material layer comprises at least one of AlGaN, GaN, InN, Aln, InGaN, or AlIn—GaN.

9. The diode of claim 1 wherein the second semiconductor material layer comprises compound semiconductors containing arsenic including at least one of GaAs, InAs, AlAs, InGaAs, AlGaAs, or InAlGaAs.

10. The diode of claim 1 wherein the first and second electrodes comprise a metal including at least one of Al, Ni, Ti, TiW, TiN, TiAu, TiAlMoAu, TiAlNiAu, or TiAlPtAu.

11. The diode of claim 1 wherein the first layer of insulating material is a gate insulator comprising a dielectric material including at least one of aluminum oxide ($Al_2O_3$), zirconium dioxide ($ZrO_2$), aluminum nitride (AlN), hafnium oxide ($HfO_2$), silicon dioxide ($SiO_2$), silicon nitride ($Si_3N_4$), or aluminum silicon nitride (AlSiN).

12. The diode of claim 1 further comprising:
   a fifth layer of insulating material disposed on the fourth insulating layer;
   a second via disposed in the fifth layer of insulating material and coupled to the first via through the fourth layer of insulating material; and
   a second field plate disposed in the fifth layer of insulating material, wherein an edge of the second field plate laterally extends towards the second via in the fifth layer of insulating material, wherein an edge of the second field plate is separated in the fifth layer of insulating material by a third lateral distance from an edge of the second via, wherein the second field plate is coupled to the first field plate through the fourth layer of insulating material.

13. The diode of claim 12 wherein the edge of the second field plate laterally extends towards the second via a fourth lateral distance greater than second lateral distance such that a sum of the third lateral distance and the fourth lateral distance is equal to the second lateral distance.

14. The diode of claim 12 further comprising a third field plate disposed in the third layer of insulating material, wherein an edge of the third field plate laterally extends towards the first via in the third layer of insulating material, wherein an edge of the third field plate is a fourth lateral distance from the edge of the first field plate such that a sum of the second lateral distance and the fourth lateral distance is equal to a total lateral distance from the edge of the third field plate to the first via.

\* \* \* \* \*